United States Patent
Hsieh et al.

(10) Patent No.: US 11,385,270 B2
(45) Date of Patent: Jul. 12, 2022

(54) CAPACITANCE-TYPE SENSING SYSTEM AND WEARABLE DEVICE FOR INDIRECT CONTACT

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Hua-Yueh Hsieh, Guangdong (CN); Hsuan-Yun Lee, Guangdong (CN); Ching-Lin Li, Guangdong (CN); Yen-Heng Huang, Guangdong (CN); Teng-Chi Chang, Guangdong (CN); Bo-Rong Lin, Guangdong (CN)

(73) Assignees: Interface Technology (ChengDu) Co., Ltd., Sichuan (CN); Interface Optoelectronics (ShenZhen) Co., Ltd., Guangdong (CN); General Interface Solution Limited, Miaoli County (TW)

( * ) Notice: Subject to any disclaimer, the term of this patent is extended or adjusted under 35 U.S.C. 154(b) by 258 days.

(21) Appl. No.: 16/879,786

(22) Filed: May 21, 2020

(65) Prior Publication Data
US 2021/0247430 A1  Aug. 12, 2021

(30) Foreign Application Priority Data
Feb. 9, 2020  (CN) .......................... 202010085910.X (51) Int. Cl.
*G01R 27/26*  (2006.01)
*G01D 5/24*  (2006.01)
(Continued)

(52) U.S. Cl.
CPC ............ *G01R 27/2605* (2013.01); *G01D 5/24* (2013.01); *H03K 17/955* (2013.01); *G06F 1/163* (2013.01); *G06F 3/0412* (2013.01)

(58) Field of Classification Search
CPC .... G01R 27/00; G01R 27/02; G01R 27/2605; G01D 5/00; G01D 5/12; G01D 5/14; G01D 5/24; G01D 5/241; G01D 5/2412; H03K 17/00; H03K 17/94; H03K 17/945; H03K 17/955; H03K 17/96; H03K 17/962; H03K 2017/9602; H03K 2017/9604;
(Continued)

(56) References Cited

U.S. PATENT DOCUMENTS

2009/0290279 A1* 11/2009 Rodgriguez .............. H05F 3/02
361/220

FOREIGN PATENT DOCUMENTS

CN  103226016 A *  7/2013 ......... G01C 19/5733
CN  109426330 A *  3/2019
(Continued)

*Primary Examiner* — Hoai-An D. Nguyen
(74) *Attorney, Agent, or Firm* — CKC & Partners Co., LLC (57) ABSTRACT

A capacitance-type sensing system for indirect contact includes a capacitance-type sensor and a grounding conductor. The capacitance-type sensor includes a sensing electrode and a driving circuit electrically connected to the sensing electrode. The driving circuit has a grounding terminal. The grounding conductor is electrically connected to the grounding terminal and configured to contact a grounding surface. A contact area of the grounding conductor is greater than or equal to 3000 mm$^2$.

18 Claims, 10 Drawing Sheets

(51) Int. Cl.
*H03K 17/955* (2006.01)
*G06F 1/16* (2006.01)
*G06F 3/041* (2006.01)

(58) Field of Classification Search
CPC .... H03K 2017/9606; H03K 2017/9609; G06F 3/00; G06F 3/01; G06F 3/011; G06F 3/03; G06F 3/041; G06F 3/044; G06F 1/00; G06F 1/16; G06F 1/1613; G06F 1/163
See application file for complete search history.

(56) References Cited

FOREIGN PATENT DOCUMENTS

| | | | | |
|---|---|---|---|---|
| JP | 2004191094 A | * | 7/2004 | |
| WO | WO-2014088768 A2 | * | 6/2014 | ......... A61B 5/02411 |

* cited by examiner

CAPACITANCE-TYPE SENSING SYSTEM AND WEARABLE DEVICE FOR INDIRECT CONTACT

CROSS-REFERENCE TO RELATED APPLICATION

This application claims priority to China application No. 202010085910.X filed on Feb. 9, 2020, which is herein incorporated by reference in its entirety.

BACKGROUND

Field of Invention

The embodiments of the present disclosure relate to a sensing system and a wearable device, and more particularly, to a capacitance-type sensing system for indirect contact and a capacitance-type sensing wearable device for indirect contact.

Description of Related Art

In a typical capacitive touch sensing technology, a capacitive sensor can sense that a conductor directly contacts a sensing electrode of the capacitive sensor. That is, when a first conductor contacts the sensing electrode of the capacitive sensor, the capacitive sensor can sense the contact of the first conductor. However, if a second conductor subsequently contacts the first conductor, the capacitive sensor cannot detect that the second conductor contacts the first conductor. That is, the existing capacitive sensor cannot sense an indirect contact.

SUMMARY

An object of the present disclosure is to provide a capacitance-type sensing system for indirect contact and a capacitance-type sensing wearable device for indirect contact that can sense an indirect contact.

According to the object of the present disclosure, a capacitance-type sensing system for indirect contact is provided, and includes a capacitance-type sensor and a grounding conductor. The capacitance-type sensor includes a sensing electrode and a driving circuit. The sensing electrode and the driving circuit are electrically connected with each other, and the driving circuit has a grounding terminal. The grounding conductor is electrically connected to the grounding terminal and configured to contact a grounding surface. A contact area of the grounding conductor is greater than or equal to 3000 $mm^2$.

In some embodiments, the capacitance-type sensing system for indirect contact further includes a contacting conductor and a first conductor to-be-tested. The contacting conductor is configured to contact the sensing electrode. When the contacting conductor contacts the sensing electrode, the driving circuit obtains a first capacitance value of the sensing electrode to the grounding terminal. The first conductor to-be-tested is configured to contact the contacting conductor. When the first conductor to-be-tested contacts the contacting conductor, the driving circuit obtains a second capacitance value of the sensing electrode to the grounding terminal, and determines whether the first conductor to-be-tested contacts the contacting conductor according to a difference value between the first capacitance value and the second capacitance value.

In some embodiments, a contact area between the sensing electrode and the contacting conductor is greater than or equal to 10 $mm^2$.

In some embodiments, an impedance of the contacting conductor is 0Ω (ohm)-30 MΩ (million ohm).

In some embodiments, an impedance of the first conductor to-be-tested is 0Ω-30 MΩ.

In some embodiments, the capacitance-type sensing system for indirect contact further includes an insulating layer. The grounding conductor is disposed on the contacting conductor through the insulating layer.

In some embodiments, the capacitance-type sensing system for indirect contact further includes a second conductor to-be-tested. The second conductor to-be-tested is configured to contact the contacting conductor. When the second conductor to-be-tested contacts the contacting conductor, the driving circuit obtains a third capacitance value of the sensing electrode to the grounding terminal, and determines whether the second conductor to-be-tested contacts the contacting conductor according to a difference value between the first capacitance value and the third capacitance value.

In some embodiments, an impedance of the second conductor to-be-tested is 0Ω-30 MΩ.

In some embodiments, the capacitance-type sensing system for indirect contact further includes a second conductor to-be-tested. The second conductor to-be-tested is configured to contact the first conductor to-be-tested. When the second conductor to-be-tested contacts the first conductor to-be-tested, the driving circuit obtains a fourth capacitance value of the sensing electrode to the grounding terminal, and determines whether the second conductor to-be-tested contacts the first conductor to-be-tested according to a difference value between the first capacitance value and the fourth capacitance value.

According to the object of the present disclosure, a capacitance-type sensing wearable device for indirect contact is provided, and includes a capacitance-type sensor and a grounding conductor. The capacitance-type sensor is configured to be worn on a human body and includes a sensing electrode and a driving circuit. The sensing electrode and the driving circuit are electrically connected with each other, and the driving circuit has a grounding terminal. The grounding conductor is configured to be worn on the human body, and is electrically connected to the grounding terminal and configured to contact a grounding surface. A contact area of the grounding conductor is greater than or equal to 3000 $mm^2$.

In some embodiments, when the human body contacts the sensing electrode, the driving circuit obtains a first capacitance value of the sensing electrode to the grounding terminal. The first conductor to-be-tested is configured to contact the human body. When the first conductor to-be-tested contacts the human body, the driving circuit obtains a second capacitance value of the sensing electrode to the grounding terminal, and determines whether the first conductor to-be-tested contacts the human body according to a difference value between the first capacitance value and the second capacitance value.

In some embodiments, a contact area between the sensing electrode and the human body is greater than or equal to 10 $mm^2$.

In some embodiments, an impedance of the human body is 0Ω (ohm)-30 MΩ (million ohm).

In some embodiments, an impedance of the first conductor to-be-tested is 0Ω-30 MΩ.

In some embodiments, the capacitance-type sensing wearable device for indirect contact further includes an insulating layer. The grounding conductor is disposed on the human body through the insulating layer.

In some embodiments, when a second conductor to-be-tested contacts the human body, the driving circuit obtains a third capacitance value of the sensing electrode to the grounding terminal, and determines whether the second conductor to-be-tested contacts the human body according to a difference value between the first capacitance value and the third capacitance value.

In some embodiments, an impedance of the second conductor to-be-tested is 0Ω-30 MΩ.

In some embodiments, when a second conductor to-be-tested contacts the first conductor to-be-tested, the driving circuit obtains a fourth capacitance value of the sensing electrode to the grounding terminal, and determines whether the second conductor to-be-tested contacts the first conductor to-be-tested according to a difference value between the first capacitance value and the fourth capacitance value.

In summary, in the capacitance-type sensing system and wearable device for indirect contact of embodiments of the present disclosure, the grounding conductor is connected to the grounding surface and the grounding terminal of the capacitance-type sensor, and the contact area of the grounding conductor is greater than or equal to 3000 $mm^2$, such that the grounding conductor can be used as a larger reference grounding terminal. Therefore, when the conductor to-be-tested contacts the contacting conductor (e.g., a human body), an effective loop can be formed, and the signal amount of the loop is larger than that in the case without the grounding conductor, which is beneficial to determine whether the conductor to-be-tested contacts the contacting conductor and is further applied to multiple conductors to-be-tested. Thereby, the capacitance-type sensing system for indirect contact of the embodiments of the present disclosure easily, effectively, and accurately sense indirect contact and touch.

In order to make the above features and advantages of the present disclosure more apparent, the following embodiments are described in detail with reference to the accompanying drawings.

BRIEF DESCRIPTION OF THE DRAWINGS

Aspects of the present disclosure are best understood from the following detailed description in connection with the accompanying figures. It is noted that various features are not drawn to scale in accordance with the standard practice in the industry. In fact, the dimensions of the various features can be arbitrarily increased or reduced for clarity of discussion.

DETAILED DESCRIPTION

The embodiments of the present disclosure are discussed in detail below. However, it will be appreciated that the embodiments provide many applicable concepts that can be implemented in various specific contents. The embodiments discussed and disclosed are for illustrative purposes only and are not intended to limit the scope of the present disclosure. All of the embodiments of the present disclosure disclose various different features, and these features may be implemented separately or in combination as desired. In addition, the terms "first", "second", and the like, as used herein, are not intended to mean a sequence or order, and are merely used to distinguish elements or operations described in the same technical terms. Furthermore, the spatial relationship between two elements described in the present disclosure applies not only to the orientation depicted in the drawings, but also to the orientations not represented by the drawings, such as the orientation of the inversion.

Figure 1:
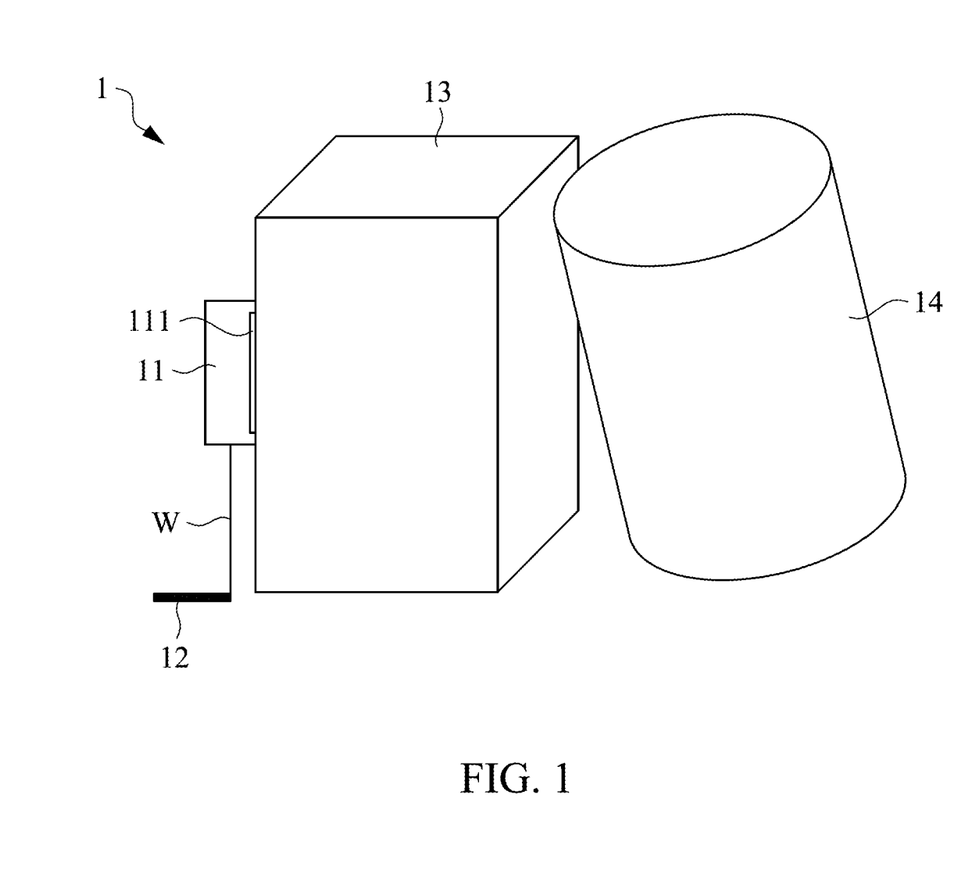
FIG. 1 is a schematic diagram of a capacitance-type sensing system for indirect contact according to embodiments of the present disclosure.
Figure 2:
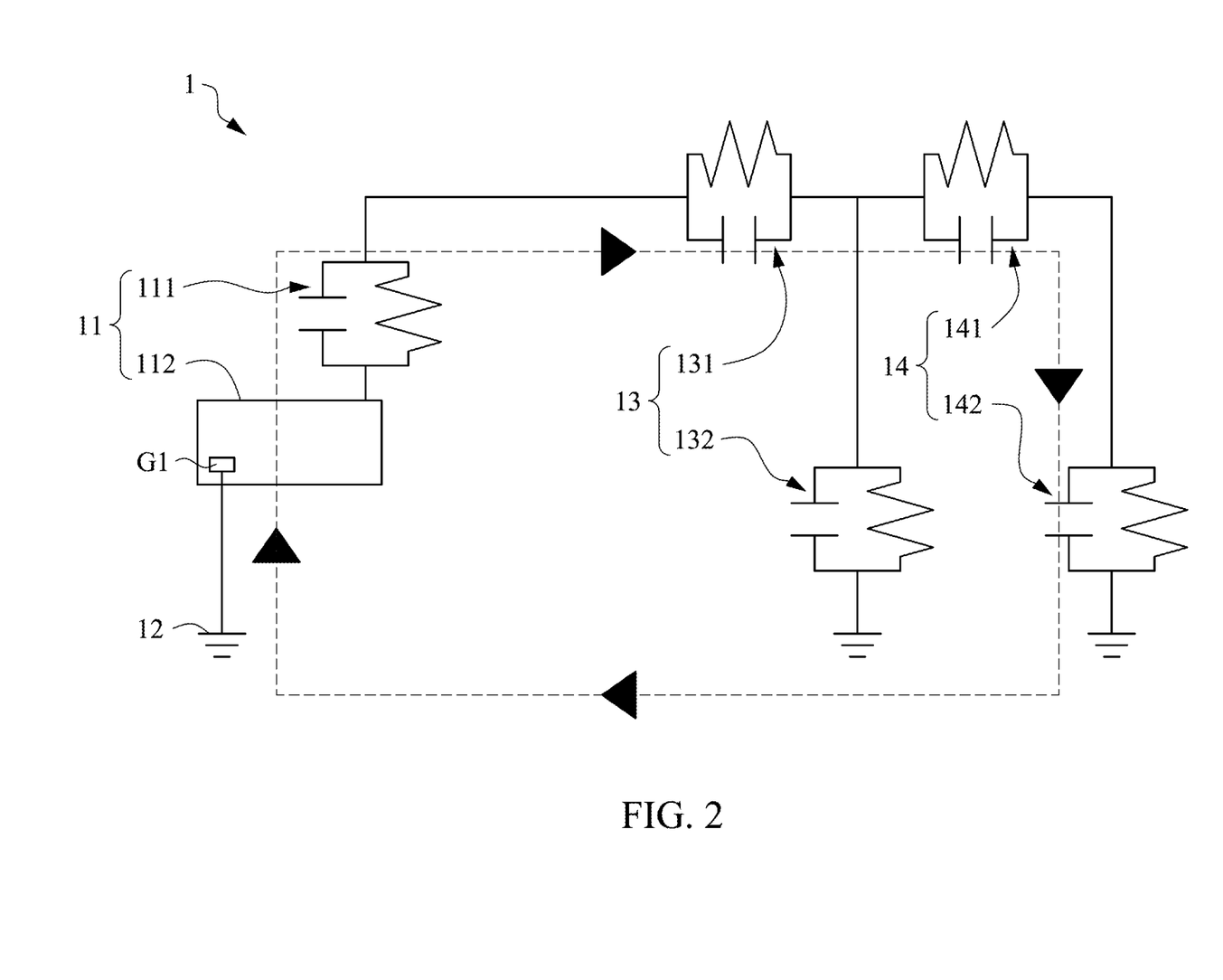
FIG. 2 is a schematic diagram of an equivalent circuit of the capacitance-type sensing system for indirect contact of FIG. 1.

FIG. 1 is a schematic diagram of a capacitance-type sensing system 1 for indirect contact according to embodiments of the present disclosure, and FIG. 2 is a schematic diagram of an equivalent circuit of the capacitance-type sensing system 1 for indirect contact. Referring to FIG. 1 and FIG. 2, the capacitance-type sensing system 1 for indirect contact includes a capacitance-type sensor 11, a grounding conductor 12, a contacting conductor 13, and a first conductor to-be-tested 14.

The capacitance-type sensor 11 includes a sensing electrode 111 and a driving circuit 112. The sensing electrode 111 and the driving circuit 112 are electrically connected with each other. The sensing electrode 111 is, for example, a sheet-like electrode or an electrode of another shape, and its equivalent circuit is a resistance-capacitance parallel connection as shown in FIG. 2. The driving circuit 112 has a grounding terminal G1 and can sense a capacitance value of the sensing electrode 111 to the grounding terminal G1.

The grounding conductor 12 contacts a grounding surface and is electrically connected to the grounding terminal G1. The grounding conductor 12 is, for example, a metal sheet or a conductor of another shape or material. In one example, the grounding conductor 12 is a copper foil. The grounding surface is, for example, ground or other surfaces that can be used for grounding. The grounding conductor 12 is electrically connected to the grounding terminal G1 of the driving circuit 112 through a wire W, for example. In one embodiment, a contact area between the grounding conductor 12 and the grounding surface is greater than or equal to 3000 mm². That is, the grounding conductor 12 has an area which is greater than or equal to 3000 mm². If the grounding conductor 12 is in full contact with the grounding surface, the area of the grounding conductor 12 is equal to the contact area between the grounding conductor 12 and the grounding surface.

The contacting conductor 13 contacts the sensing electrode 111. The contacting conductor 13 is, for example, a biological conductor or a metal conductor. An equivalent circuit of the contacting conductor 13 is a resistance-capacitance parallel connection, and includes its own resistance-capacitance parallel connection 131 and a resistance-capacitance parallel connection 132 to ground. In one embodiment, an impedance of the contacting conductor 13 is 0Ω-30 MΩ. In one embodiment, a contact area between the sensing electrode 111 and the contacting conductor 13 is greater than or equal to 10 mm². That is, the sensing electrode 111 has an area which is greater than or equal to 10 mm². If the sensing electrode 111 is in full contact with the contacting conductor 13, the area of the sensing electrode 111 is equal to the contact area of the sensing electrode 111 and the contacting conductor 13.

The first conductor to-be-tested 14 may contact the contacting conductor 13. The first conductor to-be-tested 14 is, for example, a biological conductor or a metal conductor. An equivalent circuit of the first conductor to-be-tested 14 is a resistance-capacitance parallel connection, and includes its own resistance-capacitance parallel connection 141 and a resistance-capacitance parallel connection 142 to ground. In one embodiment, an impedance of the first conductor to-be-tested 14 is 0Ω (ohm) to 30 MΩ (million ohm).

Since the grounding conductor 12 of the capacitance-type sensing system 1 for indirect contact can be used as a larger reference grounding terminal, an effective loop can be formed (as shown by the dotted line in FIG. 2) when the first conductor to-be-tested 14 contacts the contacting conductor 13, and a signal amount of the loop is larger than that of the case without the grounding conductor 12, which is helpful to determine whether the first conductor to-be-tested 14 contacts the contacting conductor 13 or not.

Figure 3A:
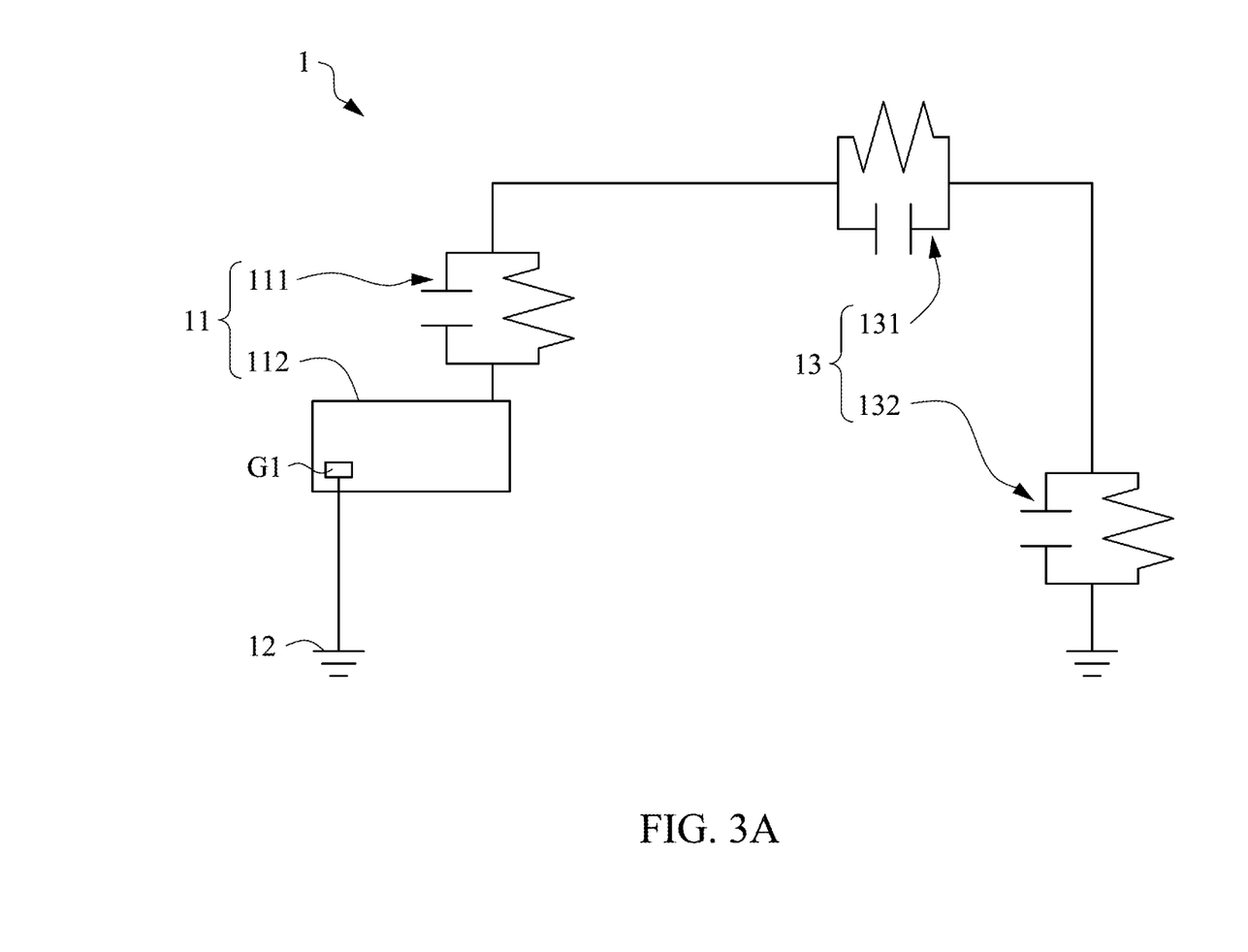
FIG. 3A is a schematic diagram of an equivalent circuit of a contacting conductor contacting a sensing electrode of a capacitance-type sensing system for indirect contact according to embodiments of the present disclosure.
Figure 3B:
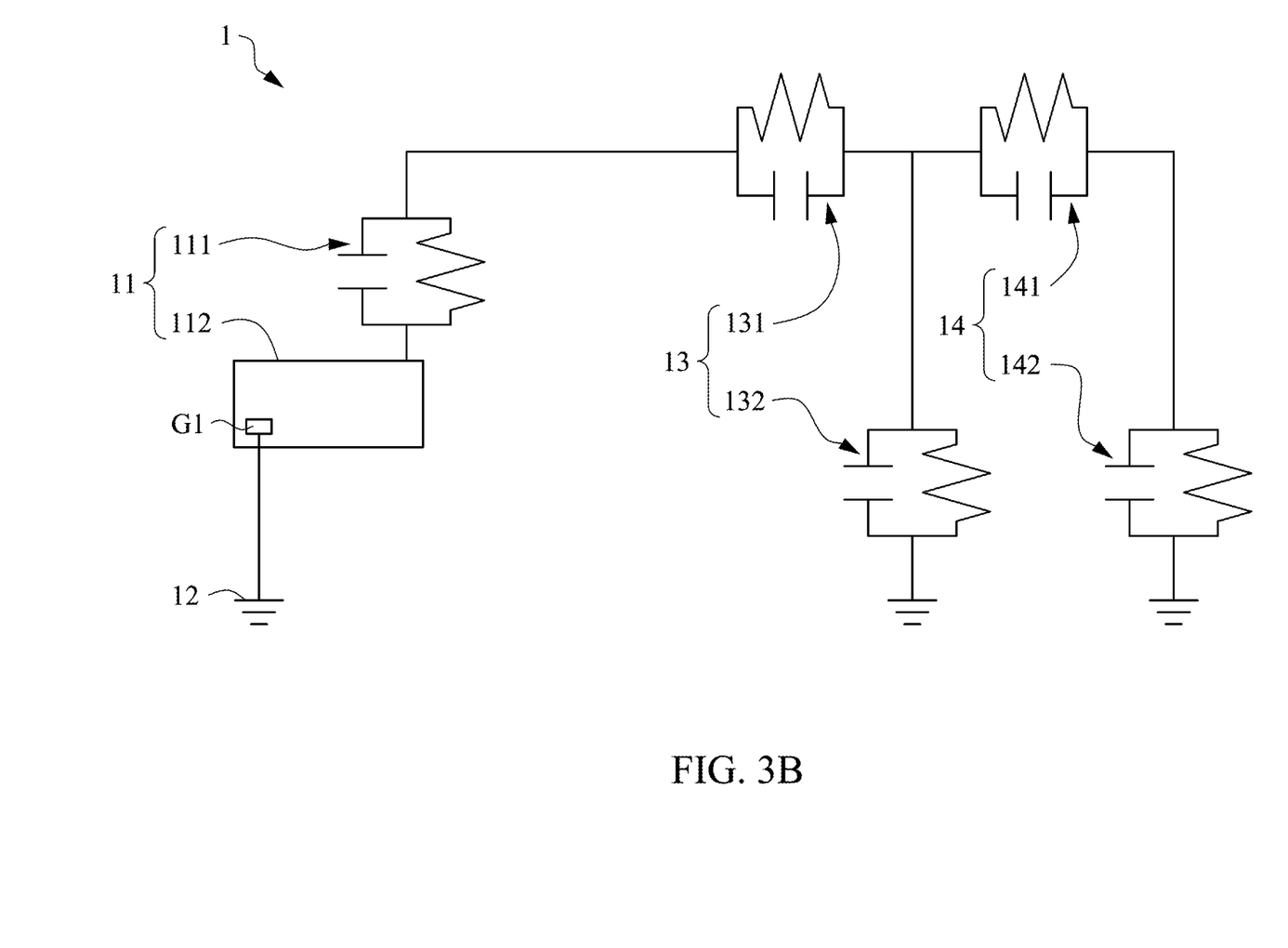
FIG. 3B is a schematic diagram of an equivalent circuit of a contacting conductor of a capacitance-type sensing system for indirect contact according to embodiments of the present disclosure contacting a sensing electrode and a first conductor to-be-tested contacts the contacting conductor.

The following describes how the capacitance-type sensing system 1 for indirect contact senses whether the first conductor to-be-tested 14 contacts the contacting conductor 13 or not. First, when the contacting conductor 13 contacts the sensing electrode 111, its equivalent circuit is as shown in FIG. 3A, and the driving circuit 112 obtains a first capacitance value of the sensing electrode 111 to the grounding terminal G1. Next, when the first conductor to-be-tested 14 contacts the contacting conductor 13, its equivalent circuit is as shown in FIG. 3B, and the driving circuit 112 obtains a second capacitance value of the sensing electrode 111 to the grounding terminal G1. Then, the driving circuit 112 can determine whether the first conductor to-be-tested 14 contacts the contacting conductor 13 based on a difference value between the first capacitance value and the second capacitance value. In an example, the driving circuit 112 may compare the difference value with a threshold value to determine whether the first conductor to-be-tested 14 contacts the contacting conductor 13, in which the threshold value may be preset or adjustable.

Figure 4:
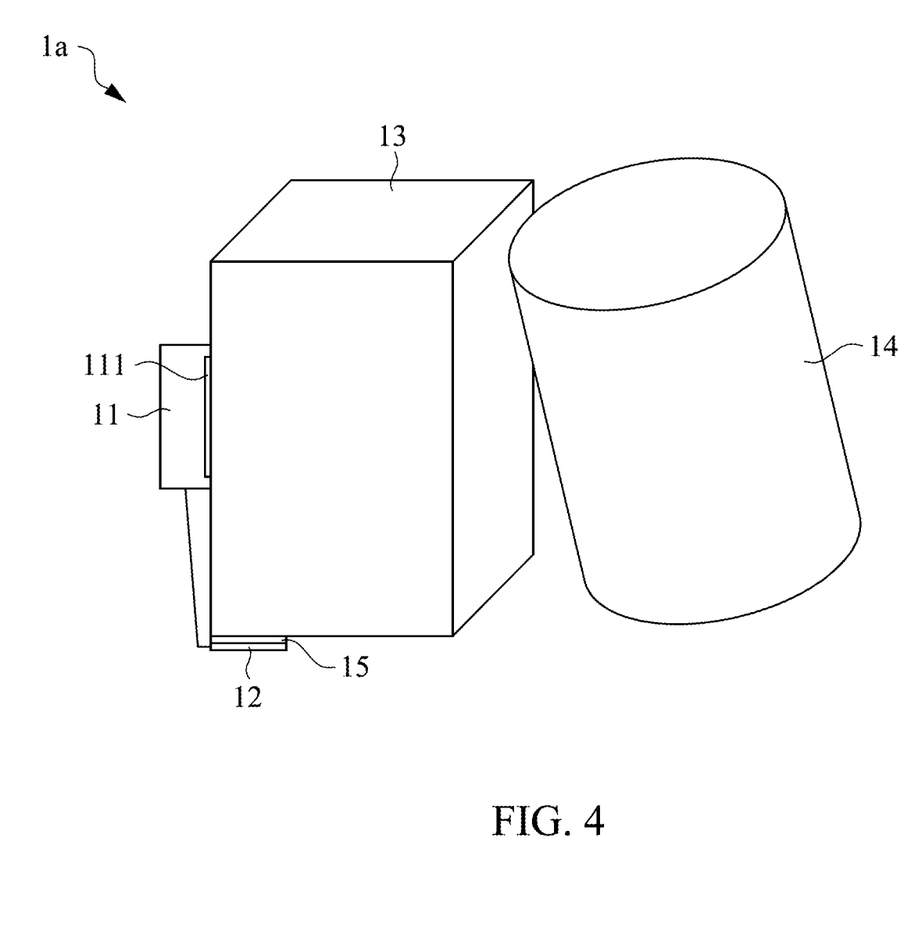
FIG. 4 is a schematic diagram of another capacitance-type sensing system for indirect contact according to embodiments of the present disclosure.

FIG. 4 is a schematic diagram of another capacitance-type sensing system 1a for indirect contact according to embodiments of the present disclosure. Referring to FIG. 4, a main difference from the capacitance-type sensing system 1 for indirect contact is that the grounding conductor 12 of the capacitance-type sensing system 1a for indirect contact is disposed on the contacting conductor 13 through an insulating layer 15. In addition, the capacitance-type sensor 11 is also disposed on the contacting conductor 13. Thereby, when the contacting conductor 13 is a human body, the human may wear the capacitance-type sensor 11, the insulating layer 15, and the grounding conductor 12, such that the capacitance-type sensing system 1a for indirect contact has a wearable function.

Figure 5A:
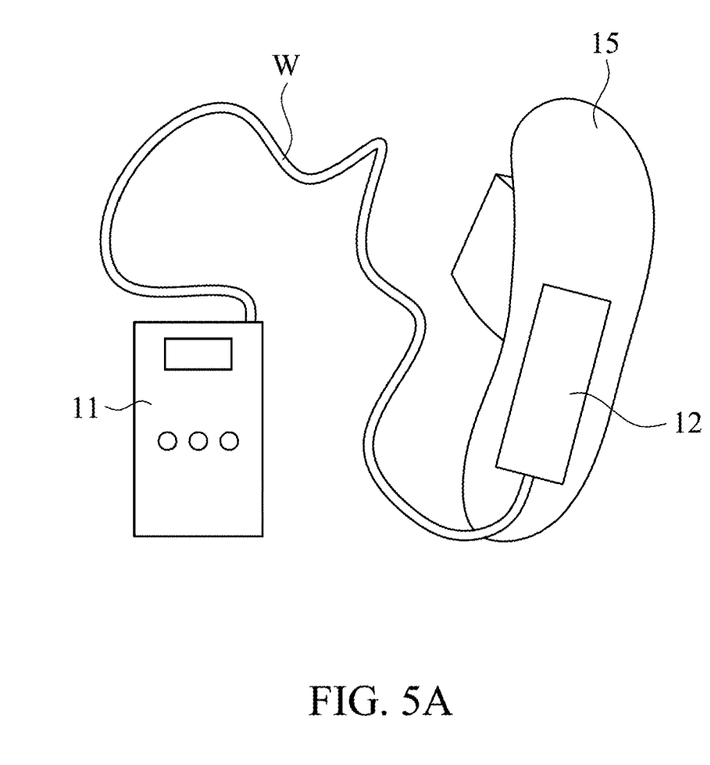
FIG. 5A and FIG. 5B are schematic diagrams of an application of the capacitance-type sensing system for a wearable device for indirect contact of FIG. 4.
Figure 5B:
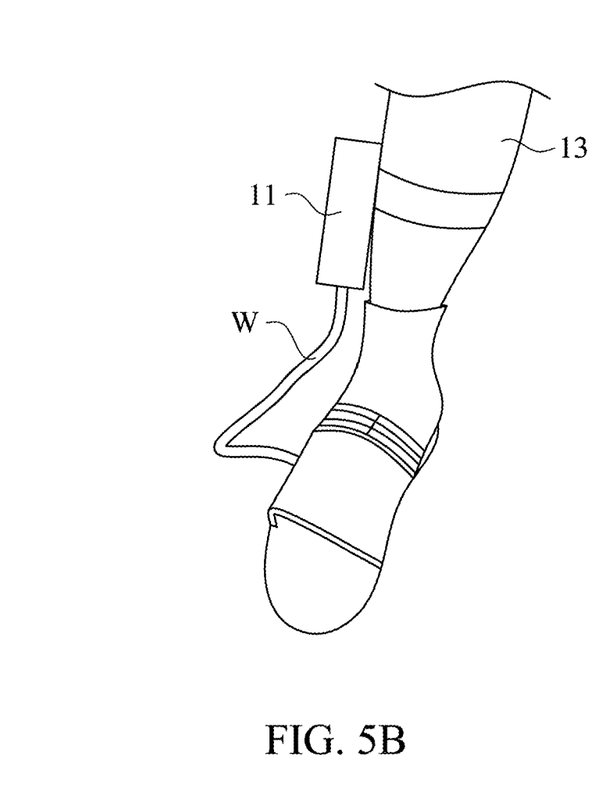

FIG. 5A and FIG. 5B are schematic diagrams of an application of the capacitance-type sensing system 1a for indirect contact of FIG. 4. Referring to FIG. 5A, the grounding conductor 12 is a copper foil, the insulating layer 15 is an entire shoe body or a bottom side of the shoe body, and the grounding conductor 12 is fixed on the insulating layer 15 and is electrically connected to the capacitance-type sensor 11 through a wire W. Referring to FIG. 5B, the contacting conductor 13 is a human foot as an example, the capacitance-type sensor 11 is worn on a calf with shoes worn on a foot, and the grounding conductor 12 is fixed to a bottom surface of the shoe and contacts a ground (as a grounding surface). In this situation, when another person (as the first conductor to-be-tested) touches a person (as the contacting conductor 13) wearing the capacitance-type sensor 11, the capacitance-type sensor 11 can sense that the first conductor to-be-tested contacts the contacting conductor 13.

Adults are used as the contacting conductor and the first conductor to-be-tested for verification. When an adult wears a capacitance-type sensor 11 that is not electrically connected to the grounding conductor 12 (as shown in FIG. 5A), a normalized signal amount of the difference value between the first capacitance value and the second capacitance value obtained by the driving circuit 112 is 54-61. When an adult wears a capacitance-type sensor 11 that is electrically connected to the grounding conductor 12, the normalized signal amount which is obtained can reach 2150-2524. Obviously, the capacitance-type sensor 11 electrically connected to the grounding conductor 12 can more easily and accurately determine whether the first conductor to-be-tested contacts the contacting conductor.

In addition, in some examples that the first conductor to-be-tested contacting the contacting conductor results in a danger, the capacitance-type sensing system 1 or 1a for indirect contact may further include a warning module. The warning module may be electrically connected to the driving circuit 112 of the capacitance-type sensor 11, and sends an alarm signal according to a sensing result of the driving circuit 112. The alarm signal is, for example, light, sound, and image.

Figure 6:
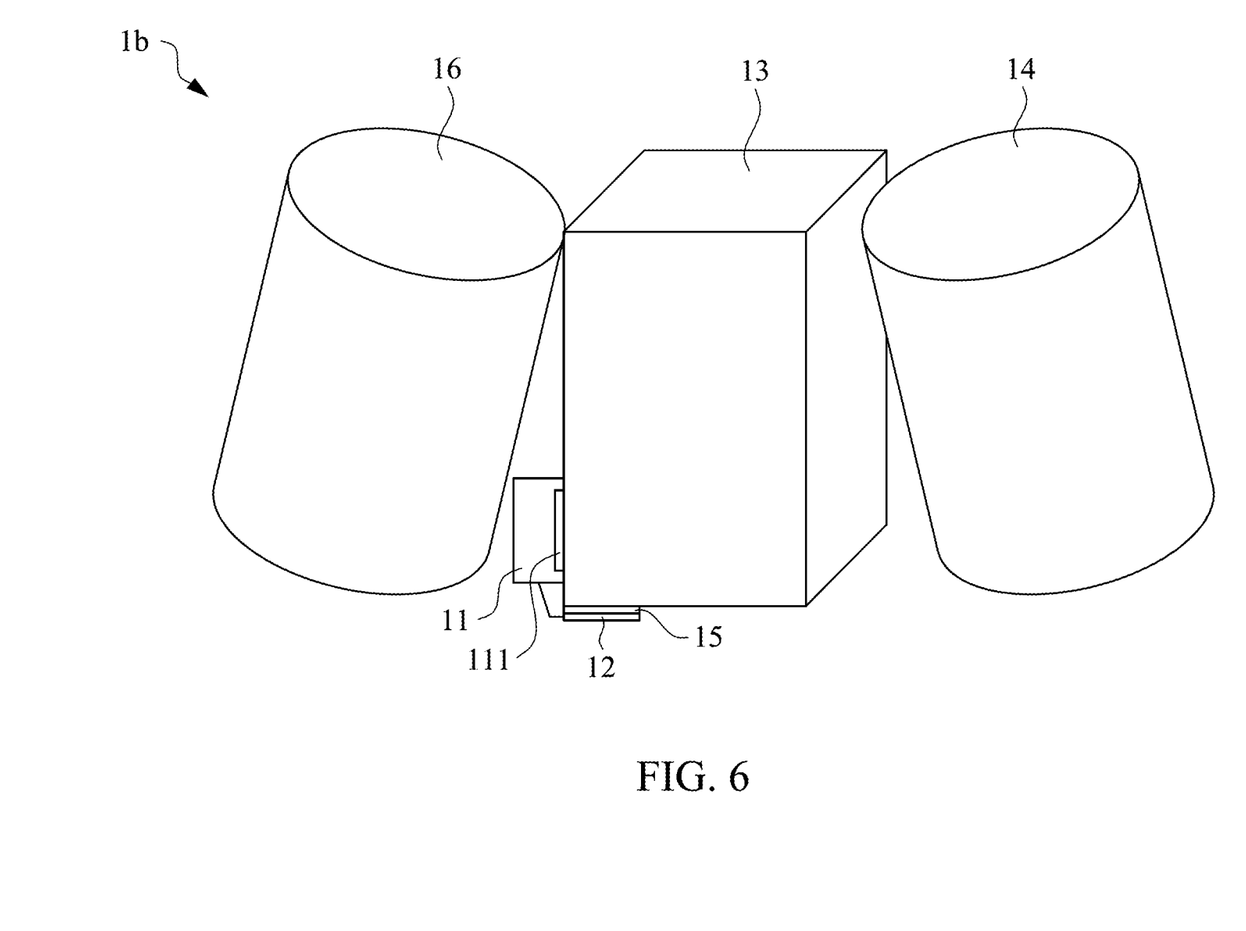
FIG. 6 is a schematic diagram of a capacitance-type sensing system for indirect contact including a second conductor to-be-tested according to embodiments of the present disclosure.
Figure 7:
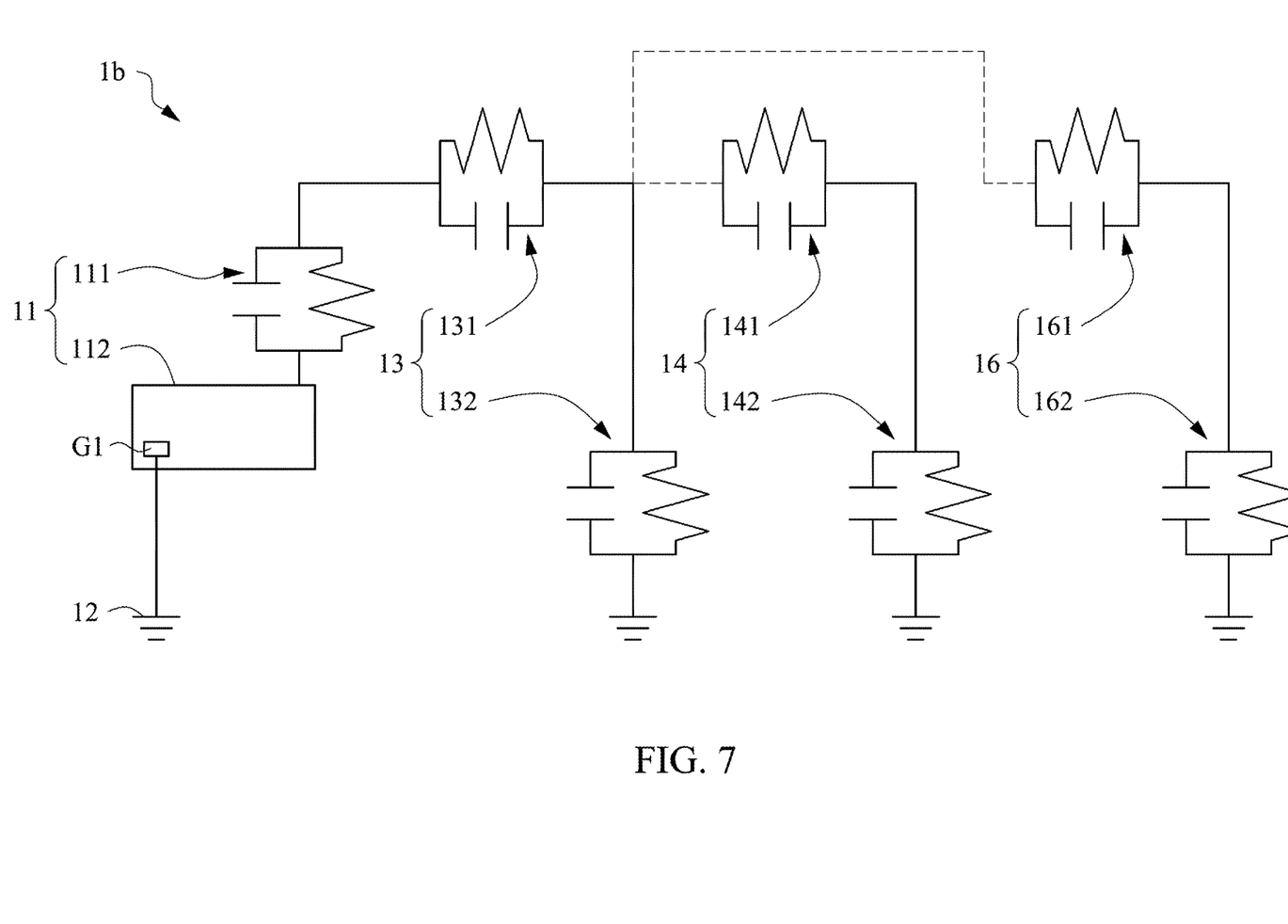
FIG. 7 is a schematic diagram of an equivalent circuit of the capacitance-type sensing system for indirect contact of FIG. 6.

In addition to the first conductor to-be-tested, the capacitance-type sensing system for indirect contact of the embodiments of the present disclosure may be further used to sense a contact of a second conductor to-be-tested. FIG. 6 is a schematic diagram of a capacitance-type sensing system 1b for indirect contact including a second conductor to-be-tested according to embodiments of the present disclosure, and FIG. 7 is a schematic diagram of an equivalent circuit of the capacitance-type sensing system 1b for indirect contact. Referring to FIG. 6 and FIG. 7, in addition to the capacitance-type sensor 11, the grounding conductor 12, the contacting conductor 13, and the first conductor to-be-tested 14, the capacitance-type sensing system 1b for indirect contact further includes a second conductor to-be-tested 16. The second conductor to-be-tested 16 contacts the contacting conductor 13. The second conductor to-be-tested 16 is, for example, a biological conductor or a metal conductor. The equivalent circuit of the second conductor to-be-tested 16 is a resistance-capacitance parallel connection, and includes its own resistance-capacitance parallel connection 161 and a resistance-capacitance parallel connection 162 to ground. In one embodiment, an impedance of the second conductor to-be-tested 16 is 0Ω-30 MΩ.

The following describes how the capacitance-type sensing system 1b for indirect contact senses whether the first conductor to-be-tested 14 contacts the contacting conductor 13 and whether the second conductor to-be-tested 16 contacts the contacting conductor 13. First, when the contacting conductor 13 contacts the sensing electrode 111, its equivalent circuit is as shown in FIG. 3A, and the driving circuit 112 obtains the first capacitance value of the sensing electrode 111 to the grounding terminal G1. Next, when the first conductor to-be-tested 14 contacts the contacting conductor 13, its equivalent circuit is as shown in FIG. 3B, and the driving circuit 112 obtains the second capacitance value of the sensing electrode 111 to the grounding terminal G1. Then, the driving circuit 112 can determine whether the first conductor to-be-tested 14 contacts the contacting conductor 13 according to the difference value between the first capacitance value and the second capacitance value. Then, when the second conductor to-be-tested 16 contacts the contacting conductor 13, its equivalent circuit is as shown in FIG. 7, and the driving circuit 112 obtains a third capacitance value of the sensing electrode 111 to the grounding terminal G1. The driving circuit 112 may determine whether the second conductor to-be-tested 16 contacts the contacting conductor 13 based on a difference value between the first capacitance value and the third capacitance value, a difference value between the second capacitance value and the third capacitance value, or a combination of the first capacitance value, the second capacitance value, and the third capacitance value. The above determinations can be made by comparisons with threshold values.

Figure 8:
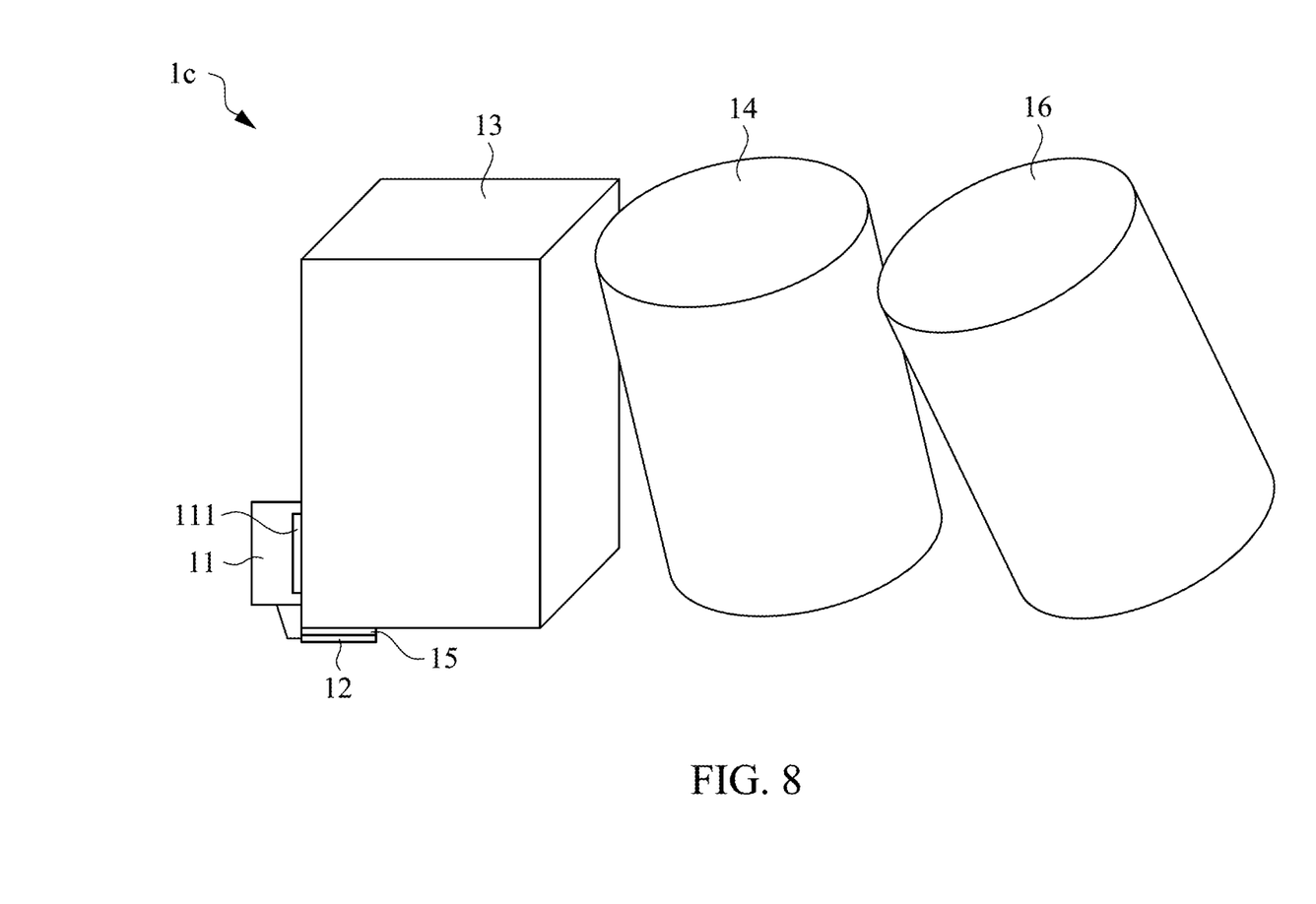
FIG. 8 is a schematic diagram of another capacitance-type sensing system for indirect contact including a second conductor to-be-tested according to embodiments of the present disclosure.
Figure 9:
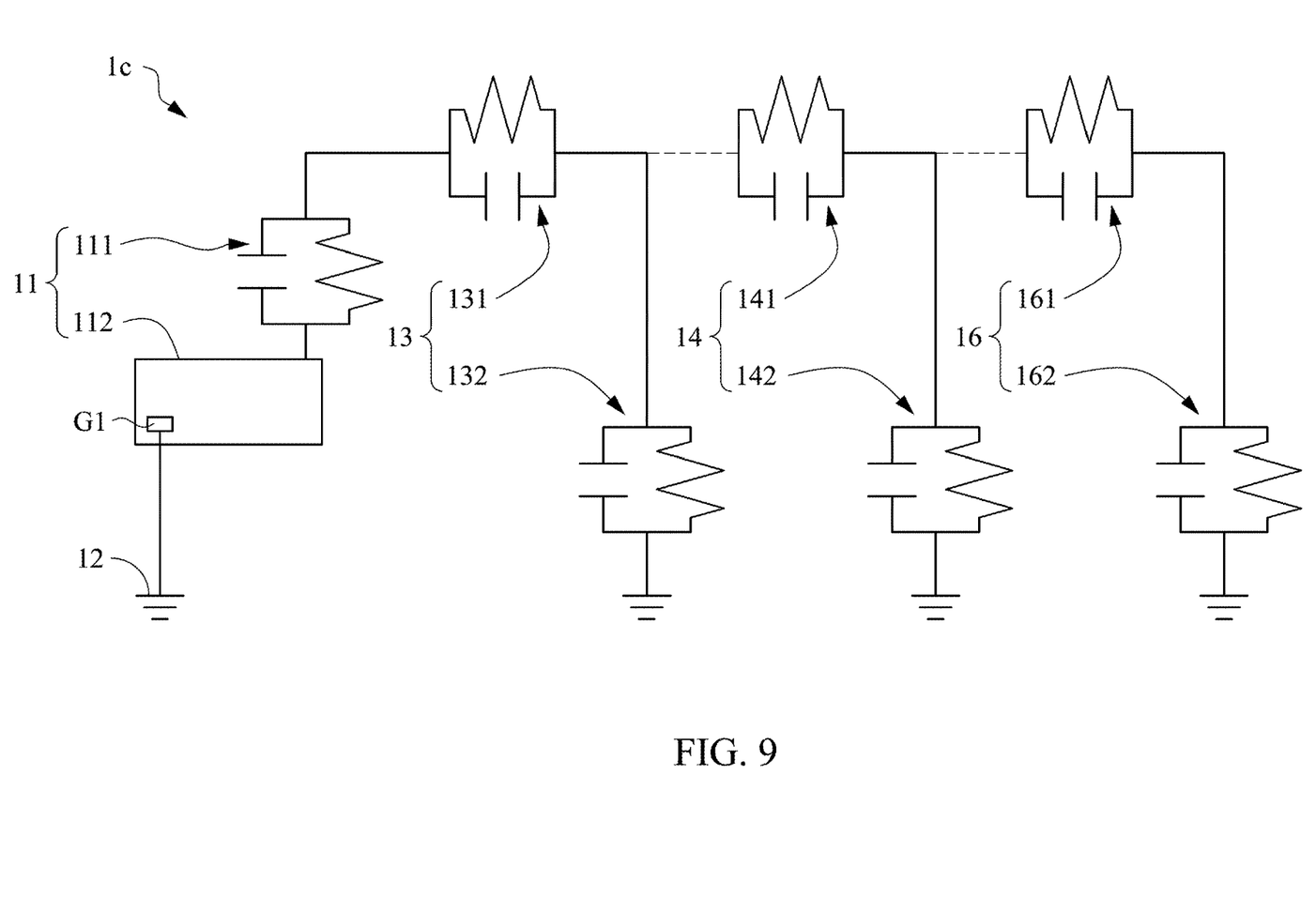
FIG. 9 is a schematic diagram of an equivalent circuit of the capacitance-type sensing system for indirect contact of FIG. 8.

FIG. 8 is a schematic diagram of another capacitance-type sensing system 1c for indirect contact including a second conductor to-be-tested according to embodiments of the present disclosure, and FIG. 9 is a schematic diagram of an equivalent circuit of the capacitance-type sensing system 1c for indirect contact. Referring to FIG. 8 and FIG. 9, in this embodiment, the second conductor to-be-tested 16 contacts the first conductor to-be-tested 14, and an equivalent circuit of the second conductor to-be-tested 16 also includes its own resistance-capacitance parallel connection 161 and a resistance-capacitance parallel connection 162 to ground.

The following describes how the capacitance-type sensing system 1c for indirect contact senses whether the first conductor to-be-tested 14 contacts the contacting conductor 13 and whether the second conductor to-be-tested 16 contacts the first conductor to-be-tested 14. First, when the contacting conductor 13 contacts the sensing electrode 111, its equivalent circuit is as shown in FIG. 3A, and the driving circuit 112 obtains the first capacitance value of the sensing electrode 111 to the grounding terminal G1. Next, when the first conductor to-be-tested 14 contacts the contacting conductor 13, its equivalent circuit is as shown in FIG. 3B, and the driving circuit 112 obtains the second capacitance value of the sensing electrode 111 to the grounding terminal G1. Then, the driving circuit 112 can determine whether the first conductor to-be-tested 14 contacts the contacting conductor 13 according to the difference value between the first capacitance value and the second capacitance value. Then, when the second conductor to-be-tested 16 contacts the first conductor to-be-tested 14, its equivalent circuit is as shown in FIG. 9, and the driving circuit 112 obtains a fourth capacitance value of the sensing electrode 111 to the grounding terminal G1. The driving circuit 112 may determine whether the second conductor to-be-tested 16 contacts the first conductor to-be-tested 14 based on a difference value between the first capacitance value and the fourth capacitance value, a difference value between the second capacitance value and the fourth capacitance value, or a combination of the first capacitance value, the second capacitance value, and the fourth capacitance value. The above determinations can be made by comparisons with threshold values.

As can be seen from the above description, in the capacitance-type sensing system for indirect contact of the embodiments of the present disclosure, the grounding conductor is connected to the grounding surface and the grounding terminal of the capacitance-type sensor, and the contact area of the grounding conductor is greater than or equal to 3000 mm$^2$, such that the grounding conductor can be used as a larger reference grounding terminal. Therefore, when the conductor to-be-tested contacts the contacting conductor, an effective loop can be formed, and the signal amount of the loop is larger than that in the case without the grounding conductor, which is beneficial to determine whether the conductor to-be-tested contacts the contacting conductor and is further applied to multiple conductors to-be-tested. Thereby, the capacitance-type sensing system for indirect contact of the embodiments of the present disclosure easily, effectively, and accurately sense indirect contact and touch.

The features of several embodiments are outlined above, so those skilled in the art can understand the aspects of the present disclosure. Those skilled in the art will appreciate that the present disclosure can be readily utilized as a basis for designing or modifying other processes and structures, thereby achieving the same objectives and/or achieving the same advantages as the embodiments described herein. Those skilled in the art should also understand that these equivalent constructions do not depart from the spirit and scope of the present disclosure, and they can make various changes, substitutions and alteration without departing from the spirit and scope of this disclosure.

What is claimed is:

1. A capacitance-type sensing system for indirect contact, comprising:
   a capacitance-type sensor comprising a sensing electrode and a driving circuit, wherein the sensing electrode and the driving circuit are electrically connected with each other, and the driving circuit has a grounding terminal;
   a grounding conductor electrically connected to the grounding terminal and configured to contact a grounding surface;
   a contacting conductor configured to contact the sensing electrode, wherein when the contacting conductor contacts the sensing electrode, the driving circuit obtains a first capacitance value of the sensing electrode to the grounding terminal; and
   a first conductor to-be-tested configured to contact the contacting conductor, wherein when the first conductor to-be-tested contacts the contacting conductor, the driving circuit obtains a second capacitance value of the sensing electrode to the grounding terminal, and determines whether the first conductor to-be-tested contacts the contacting conductor according to a difference value between the first capacitance value and the second capacitance value,
   wherein a contact area of the grounding conductor is greater than or equal to 3000 mm$^2$.

2. The capacitance-type sensing system for indirect contact of claim 1, further comprising:

a second conductor to-be-tested configured to contact the first conductor to-be-tested, wherein when the second conductor to-be-tested contacts the first conductor to-be-tested, the driving circuit obtains a fourth capacitance value of the sensing electrode to the grounding terminal, and determines whether the second conductor to-be-tested contacts the first conductor to-be-tested according to a difference value between the first capacitance value and the fourth capacitance value.

3. The capacitance-type sensing system for indirect contact of claim 1, wherein a contact area between the sensing electrode and the contacting conductor is greater than or equal to 10 mm$^2$.

4. The capacitance-type sensing system for indirect contact of claim 1, wherein an impedance of the contacting conductor is 0Ω (ohm)-30 MΩ (million ohm).

5. The capacitance-type sensing system for indirect contact of claim 1, wherein an impedance of the first conductor to-be-tested is 0Ω-30 MΩ.

6. The capacitance-type sensing system for indirect contact of claim 1, further comprising an insulating layer, wherein the grounding conductor is disposed on the contacting conductor through the insulating layer.

7. The capacitance-type sensing system for indirect contact of claim 1, further comprising:
a second conductor to-be-tested configured to contact the contacting conductor, wherein when the second conductor to-be-tested contacts the contacting conductor, the driving circuit obtains a third capacitance value of the sensing electrode to the grounding terminal, and determines whether the second conductor to-be-tested contacts the contacting conductor according to a difference value between the first capacitance value and the third capacitance value.

8. The capacitance-type sensing system for indirect contact of claim 7, wherein an impedance of the second conductor to-be-tested is 0Ω-30 MΩ.

9. The capacitance-type sensing system for indirect contact of claim 2, wherein an impedance of the second conductor to-be-tested is 0Ω-30 MΩ.

10. A capacitance-type sensing wearable device for indirect contact, comprising:
a capacitance-type sensor configured to be worn on a human body, the capacitance-type sensor comprising a sensing electrode and a driving circuit, wherein the sensing electrode and the driving circuit are electrically connected with each other, and the driving circuit has a grounding terminal, wherein when the human body contacts the sensing electrode, the driving circuit obtains a first capacitance value of the sensing electrode to the grounding terminal; and a grounding conductor configured to be worn on the human body, the grounding conductor electrically connected to the grounding terminal and configured to contact a grounding surface;
wherein when a first conductor to-be-tested contacts the human body, the driving circuit obtains a second capacitance value of the sensing electrode to the grounding terminal, and determines whether the first conductor to-be-tested contacts the human body according to a difference value between the first capacitance value and the second capacitance value,
wherein a contact area of the grounding conductor is greater than or equal to 3000 mm$^2$.

11. The capacitance-type sensing wearable device for indirect contact of claim 10, wherein when a second conductor to-be-tested contacts the first conductor to-be-tested, the driving circuit obtains a fourth capacitance value of the sensing electrode to the grounding terminal, and determines whether the second conductor to-be-tested contacts the first conductor to-be-tested according to a difference value between the first capacitance value and the fourth capacitance value.

12. The capacitance-type sensing wearable device for indirect contact of claim 11, wherein an impedance of the second conductor to-be-tested is 0Ω-30 MΩ.

13. The capacitance-type sensing wearable device for indirect contact of claim 10, wherein a contact area between the sensing electrode and the human body is greater than or equal to 10 mm$^2$.

14. The capacitance-type sensing wearable device for indirect contact of claim 10, wherein an impedance of the human body is 0Ω (ohm)-30 MΩ (million ohm).

15. The capacitance-type sensing wearable device for indirect contact of claim 10, wherein an impedance of the first conductor to-be-tested is 0Ω-30 MΩ.

16. The capacitance-type sensing wearable device for indirect contact of claim 10, further comprising an insulating layer, wherein the grounding conductor is disposed on the human body through the insulating layer.

17. The capacitance-type sensing wearable device for indirect contact of claim 10, wherein when a second conductor to-be-tested contacts the human body, the driving circuit obtains a third capacitance value of the sensing electrode to the grounding terminal, and determines whether the second conductor to-be-tested contacts the human body according to a difference value between the first capacitance value and the third capacitance value.

18. The capacitance-type sensing wearable device for indirect contact of claim 17, wherein an impedance of the second conductor to-be-tested is 0Ω-30 MΩ.

* * * * *